United States Patent
Ramaraju

(10) Patent No.: US 9,035,629 B2
(45) Date of Patent: *May 19, 2015

(54) VOLTAGE REGULATOR WITH DIFFERENT INVERTING GAIN STAGES

(75) Inventor: Ravindraraj Ramaraju, Round Rock, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 706 days.

This patent is subject to a terminal disclaimer.

(21) Appl. No.: 13/097,411

(22) Filed: Apr. 29, 2011

(65) Prior Publication Data

US 2012/0274307 A1    Nov. 1, 2012

(51) Int. Cl.
G05F 1/00 (2006.01)
G11C 5/14 (2006.01)

(52) U.S. Cl.
CPC .................................. *G11C 5/147* (2013.01)

(58) Field of Classification Search
USPC ............................ 323/273; 365/226; 327/543
See application file for complete search history.

(56) References Cited

U.S. PATENT DOCUMENTS

| | | | |
|---|---|---|---|
| 4,585,955 A | 4/1986 | Uchida | |
| 4,714,845 A | 12/1987 | Devecchi et al. | |
| 4,780,854 A | 10/1988 | Watanabe et al. | |
| 4,868,483 A | 9/1989 | Tsujimoto | |
| 5,077,518 A * | 12/1991 | Han ............................... | 365/226 |
| 5,430,682 A | 7/1995 | Ishikawa et al. | |
| 5,552,740 A | 9/1996 | Casper | |
| 5,619,164 A | 4/1997 | Tomishima | |
| 5,821,769 A | 10/1998 | Douseki | |
| 5,956,278 A | 9/1999 | Itou | |
| 5,986,923 A | 11/1999 | Zhang et al. | |
| 6,021,500 A | 2/2000 | Wang et al. | |
| 6,060,944 A | 5/2000 | Casper | |
| 6,087,893 A | 7/2000 | Oowaki et al. | |
| 6,111,394 A * | 8/2000 | Casper .......................... | 323/273 |
| 6,114,843 A | 9/2000 | Olah | |
| 6,177,826 B1 | 1/2001 | Mashiko et al. | |
| 6,236,666 B1 | 5/2001 | Mirov et al. | |
| 6,281,744 B1 | 8/2001 | Kang | |
| 6,320,795 B1 | 11/2001 | Balamurugan et al. | |
| 6,380,799 B1 | 4/2002 | Chung et al. | |
| 6,414,883 B2 | 7/2002 | Hidaka et al. | |
| 6,441,663 B1 | 8/2002 | Chuang et al. | |
| 6,509,786 B2 | 1/2003 | Uekobo | |
| 6,560,139 B2 | 5/2003 | Ma et al. | |
| 6,614,706 B2 | 9/2003 | Feurle | |
| 6,737,910 B2 | 5/2004 | Kitagawa et al. | |

(Continued)

OTHER PUBLICATIONS

U.S. Appl. No. 12/714,079, filed Feb. 26, 2010.

(Continued)

*Primary Examiner* — Jue Zhang

(57) ABSTRACT

A voltage regulator includes a regulating transistor and a control circuit. The regulating transistor has a first current electrode for providing a regulated voltage, a second current electrode, and a control electrode. The control circuit has an output coupled to the control electrode of the regulating transistor, and an input coupled to the first current electrode of the regulating transistor. The control circuit includes a first inverting gain stage having a first load element, and a second inverting gain stage having a second load element. One of the first or second load elements is characterized as being a diode and the other of the first or second load elements is biased by a bias circuit.

21 Claims, 4 Drawing Sheets

(56) References Cited

U.S. PATENT DOCUMENTS

| | | | |
|---|---|---|---|
| 6,775,112 B1 | 8/2004 | Smith et al. |
| 6,801,470 B2 | 10/2004 | Clark et al. |
| 6,836,179 B2 | 12/2004 | Mizuno et al. |
| 6,861,901 B2 | 3/2005 | Prexl et al. |
| 6,906,582 B2 | 6/2005 | Kase et al. |
| 6,909,320 B2 | 6/2005 | Chan et al. |
| 6,933,772 B1 | 8/2005 | Banerjee et al. |
| 7,026,802 B2 | 4/2006 | Gradinariu |
| 7,042,274 B2 | 5/2006 | Hazucha et al. |
| 7,055,007 B2 | 5/2006 | Flautner et al. |
| 7,061,820 B2 | 6/2006 | Deug |
| 7,064,601 B2 | 6/2006 | Kwak et al. |
| 7,080,269 B2 | 7/2006 | Baumgartner et al. |
| 7,085,943 B2 | 8/2006 | Chun et al. |
| 7,091,712 B2 | 8/2006 | Miller et al. |
| 7,099,230 B1 | 8/2006 | Tran |
| 7,110,317 B2 | 9/2006 | Song et al. |
| 7,125,842 B2 | 10/2006 | Kawabe et al. |
| 7,126,370 B2 | 10/2006 | Bhattacharya |
| 7,126,861 B2 | 10/2006 | Hose, Jr. et al. |
| 7,135,842 B2 | 11/2006 | Banerjee et al. |
| 7,155,621 B2 | 12/2006 | Dai |
| 7,164,291 B2 | 1/2007 | Mair et al. |
| 7,208,974 B1 | 4/2007 | Chui |
| 7,209,395 B2 | 4/2007 | Hsu et al. |
| 7,218,168 B1 | 5/2007 | Rahman |
| 7,235,959 B2 | 6/2007 | Sicard |
| 7,253,595 B2 * | 8/2007 | Oddoart et al. | 323/274 |
| 7,262,631 B2 | 8/2007 | Chong |
| 7,268,524 B2 | 9/2007 | Kase et al. |
| 7,292,495 B1 | 11/2007 | Kenkare et al. |
| 7,332,954 B2 | 2/2008 | Ryu et al. |
| 7,339,416 B2 | 3/2008 | Rincon-Mora et al. |
| 7,342,845 B2 | 3/2008 | Somasekhar et al. |
| 7,366,036 B2 | 4/2008 | Cheng et al. |
| 7,372,764 B2 | 5/2008 | Nautiyal et al. |
| 7,385,435 B2 | 6/2008 | Pham et al. |
| 7,400,123 B1 | 7/2008 | Voogel |
| 7,400,523 B2 | 7/2008 | Houston |
| 7,400,545 B2 | 7/2008 | Ramaraju et al. |
| 7,405,546 B2 * | 7/2008 | Amrani et al. | 323/273 |
| 7,414,457 B2 | 8/2008 | Ogawa et al. |
| 7,423,416 B1 | 9/2008 | Quinones et al. |
| 7,432,693 B2 | 10/2008 | Enjalbert |
| 7,439,718 B2 | 10/2008 | Rozen et al. |
| 7,441,137 B1 | 10/2008 | Mimberg |
| 7,446,759 B2 | 11/2008 | Yamamoto |
| 7,453,756 B2 | 11/2008 | Moyer et al. |
| 7,460,429 B2 | 12/2008 | Schoenfeld |
| 7,463,013 B2 | 12/2008 | Plojhar |
| 7,479,824 B2 | 1/2009 | Bushman et al. |
| 7,523,373 B2 | 4/2009 | Russell et al. |
| 7,533,226 B2 | 5/2009 | Flautner et al. |
| 7,539,878 B2 | 5/2009 | Vaglica |
| 7,554,312 B2 | 6/2009 | Fulton et al. |
| 7,576,594 B2 | 8/2009 | Shozo |
| 7,609,047 B2 | 10/2009 | Ravichandran |
| 7,619,440 B2 | 11/2009 | Amedeo et al. |
| 7,638,903 B2 | 12/2009 | Pelley, III et al. |
| 7,701,755 B2 | 4/2010 | Chen et al. |
| 7,706,200 B2 | 4/2010 | Chi |
| 7,737,720 B2 | 6/2010 | Idgunji et al. |
| 7,750,610 B2 | 7/2010 | Voren Kamp |
| 7,760,009 B2 | 7/2010 | Yang et al. |
| 7,808,856 B2 | 10/2010 | Ehrenreich et al. |
| 7,821,814 B2 | 10/2010 | Yamaoka et al. |
| 7,825,720 B2 | 11/2010 | Ramaraju et al. |
| 7,863,971 B1 | 1/2011 | Nayak et al. |
| 8,085,579 B2 | 12/2011 | Inoue |
| 8,324,876 B1 * | 12/2012 | Le et al. | 323/273 |
| 2007/0001223 A1 | 1/2007 | Boyd et al. |
| 2007/0210855 A1 | 9/2007 | Raimar et al. |
| 2007/0229147 A1 | 10/2007 | Doyle et al. |
| 2007/0252623 A1 | 11/2007 | Zampaglione et al. |
| 2008/0001655 A1 | 1/2008 | Pham et al. |
| 2008/0074176 A1 | 3/2008 | Yamamoto |
| 2008/0158939 A1 | 7/2008 | Chen et al. |
| 2008/0170458 A1 | 7/2008 | Haid et al. |
| 2008/0284504 A1 | 11/2008 | Hirota et al. |
| 2009/0045677 A1 | 2/2009 | Frey et al. |
| 2009/0066388 A1 | 3/2009 | Park |
| 2009/0096433 A1 | 4/2009 | Gerber et al. |
| 2009/0203410 A1 | 8/2009 | Lu |
| 2009/0237125 A1 | 9/2009 | Zhao et al. |
| 2009/0285046 A1 | 11/2009 | Ehrenreich et al. |
| 2009/0323401 A1 | 12/2009 | Huang et al. |
| 2010/0123515 A1 | 5/2010 | Sasaki et al. |
| 2010/0207688 A1 * | 8/2010 | Ramaraju et al. | 327/543 |
| 2010/0283445 A1 | 11/2010 | Ramaraju et al. |
| 2011/0221516 A1 | 9/2011 | Yamaoka et al. |

OTHER PUBLICATIONS

U.S. Appl. No. 12/786,916, filed May 25, 2010.
U.S. Appl. No. 12/850,533, filed Aug. 4, 2010.
U.S. Appl. No. 12/853,106, filed Aug. 9, 2010.
U.S. Appl. No. 13/020,565, filed Apr. 3, 2011.
U.S. Appl. No. 12/846,042, filed Jul. 29, 2010.
Bhavnagarwala et al.; "A Pico-Joule Class, 1 GHz, 32 KByte x 64b DSP SRAM with Self Reserve Bias"; 2003 Symposium on VLSI Circuits Digest of Technical Papers 2003; pp. 251-252.
Chang et al.; "The 65-nm 16-MB Shared On-Die L3 Cache for the Dual-Core Intel Xeon Processor 7100 Series"; IEEE Journal of Solid State Circuits; Apr. 2007; pp. 846-851; vol. 42, No. 4; IEEE.
Chen et al.; "A0.6 V Dual-Rail Compiler SRAM Design on 45 nm CMOS Technology With Adaptive SRAM Power for Lower VDD-min VLSIs"; IEEE Journal of Solid State Circuits; Apr. 2009; pp. 1209-1215; vol. 44, No. 4; IEEE.
Kellah et al.; "A 256-Kb Dual-Vcc SRAM Building Block in 65-nm CMOS Process With Actively Clamped Sleep Transistor"; IEEE Journal of Solid-State Circuits; Jan. 2007; pp. 233-242; IEEE.
Nii et al.; "A 90 nm Low Power 32K-Byte Embedded SRAM with Gate Leakage Suppression Circuit for Mobile Applications"; 2003 Symposium on VLSI Circuits Digest of Technical Papers; 2003; pp. 247-250.
Sackinger et al.; "A High-Swing, High-Impedance MOS Cascode Circuit"; IEEE Journal of Solid State Circuits; Feb. 1990; pp. 289-298; vol. 25 No. 1; IEEE.
Takashima et al.; "Standby/Active Mode Logic for Sub-1-V Operation ULSI Memory"; IEEE Journal of Solid State Circuits; Apr. 1994; pp. 441; vol. 29, No. 4; IEEE.
Tschanz et al.; "Dynamic Sleep Transistor and Body Bias for Active Leakage Power Control of Microprocessors"; IEEE Journal of Solid State Circuits; Nov. 2003; pp. 1838-1845; vol. 38, No. 11, IEEE.
Vangal et al.; "An 80-Tile Sub-100-W TeraFLOPS Processor in 65-nm CMOS"; IEEE Journal of Solid-State Circuits; Jan. 2008; pp. 29-41; vol. 43, No. 1; IEEE.
Wang et al.; "A 1.1 GHz 12 uA/Mb-Leakagae SRAM Design in 65 nm Ultra-Low-Power CMOS Technology With Integrated Leakage Reduction for Mobile Applications"; IEEE Journal of Solid-State Circuits; Jan. 2008; pp. 172-179; vol. 43, No. 1; IEEE.
Wang et al.; "A 4.0 Ghz 291 Mb Voltage-Scalable SRAM Design in a 32 nm High-k+Metal-Gate CMOS Technology With Integrated Power Management"; IEEE Journal of Solid-State Circuits; Jan. 2010; pp. 103-110; vol. 45, No. 1; IEEE.
Zhang et al.; "Low-Power SRAMs in Nanoscale CMOS Technologies"; IEEE Transactions on Electron Devices; pp. 145-151; vol. 55, No. 1; IEEE.
U.S. Appl. No. 12/843,547, Final Rejection mailed Aug. 8, 2012.
U.S. Appl. No. 12/843,547, Rejection mailed Apr. 13, 2012.
U.S. Appl. No. 12/372,997, Rejection mailed Apr. 27, 2010.
U.S. Appl. No. 12/372,997, NOA mailed Aug. 4, 2010.
U.S. Appl. No. 12/714,079, NOA mailed May 2, 2012.
U.S. Appl. No. 12/622,277, Rejection mailed Jan. 31, 2012.
U.S. Appl. No. 12/622,277, Rejection mailed May 17, 2012.
U.S. Appl. No. 12/622,277, NOA mailed Jul. 31, 2012.

* cited by examiner

VOLTAGE REGULATOR WITH DIFFERENT INVERTING GAIN STAGES

BACKGROUND OF THE INVENTION

1. Field of the Invention

This invention relates voltage regulators and more specifically to voltage regulators with different inverting gain stages.

2. Description of the Related Art

A voltage regulator provides a regulated voltage at a node that can be used, for example, in providing power to a circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The Figures are not necessarily drawn to scale.

DETAILED DESCRIPTION

The following sets forth a detailed description of a mode for carrying out the invention. The description is intended to be illustrative of the invention and should not be taken to be limiting.

As described herein, a circuit includes a voltage regulator having a regulating transistor and a control circuit for providing a control voltage to a control electrode of the regulating transistor for controlling the voltage of a regulated node of the voltage regulator. The control circuit includes two inverting gain stages coupled in a loop for providing negative feedback control of the regulated node. One of the two stages includes a diode as a load element and the other stage includes biased transistor as a load element where the biased transistor is biased by a bias circuit.

Figure 1:
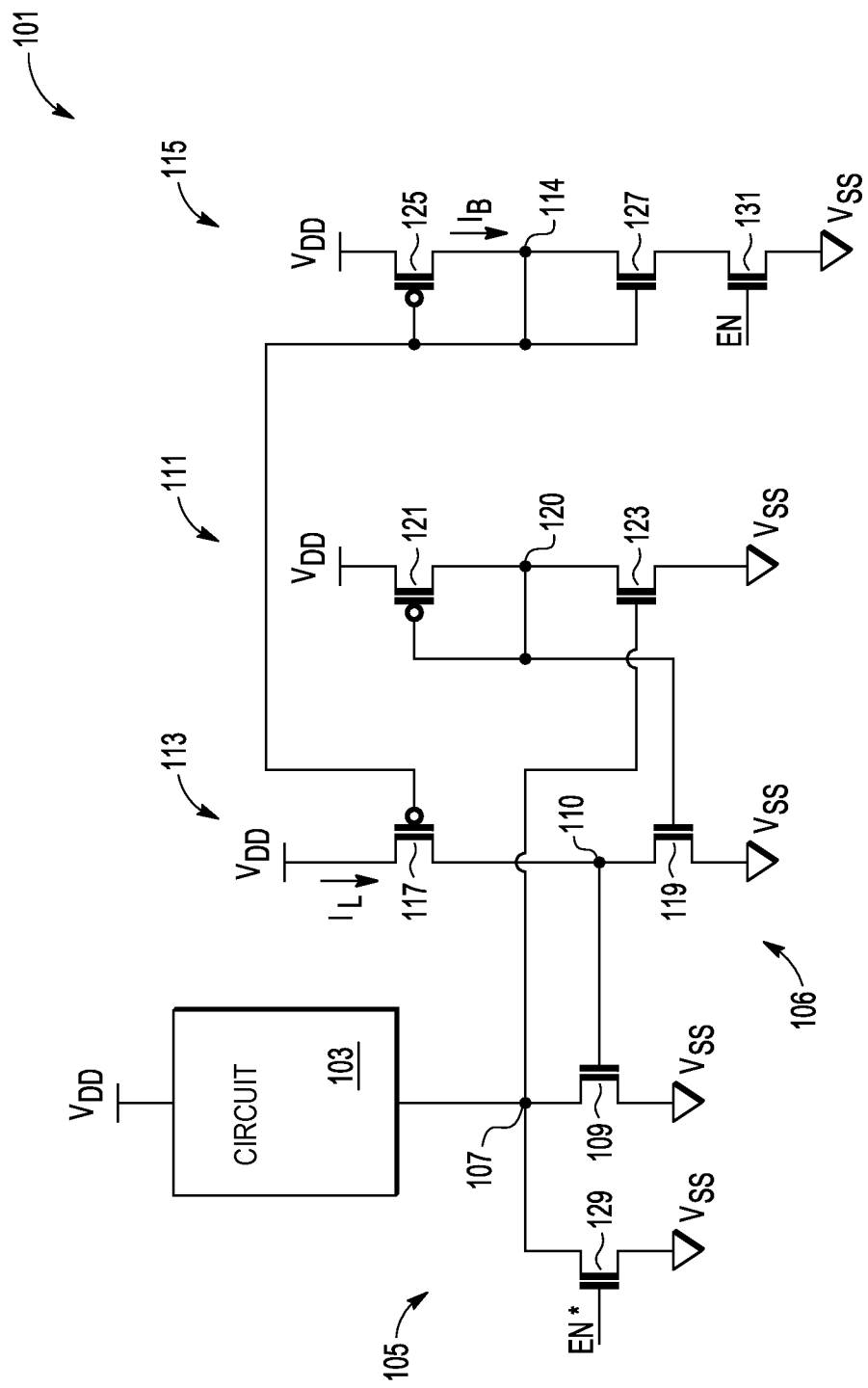
FIG. 1 is a circuit diagram of a circuit including a voltage regulator according to one embodiment of the present invention.

FIG. 1 is a circuit diagram of a circuit 101. Circuit 101 includes a circuit 103 that receives a regulated voltage from node 107 and a voltage regulator 105 for providing the regulated voltage. In one embodiment, circuit 103 includes a memory array whose low voltage power supply terminal is connected to the regulated node 107. The high voltage power supply terminal of circuit 103 is connected to a VDD terminal. In one embodiment, node 107 is coupled to the low voltage terminal of each cell of the memory array. The regulator 105 can be enabled (by an assertion of a low voltage EN* signal) to provide a higher voltage on node 107 than VSS when desired. In one embodiment, it may be desirable to provide circuit 103 with a higher low power supply voltage when circuit 103 is in a low power mode. In embodiments where circuit 103 includes a memory array, it may be desirable to place circuit 103 in a lower power mode to save power by reducing leakage current due to the lower voltage. However, a regulated voltage from node 107 may be utilized in different ways and/or may be used to provide a regulated voltage to other types of circuits in other embodiments.

Regulator 105 includes a regulating transistor 109 whose conductivity controls the voltage of regulated node 107 with respect to system ground VSS. The conductivity of transistor 109 is controlled by the voltage of node 110, which is provided by control circuit 106. In one embodiment, regulator 105 is configured to provide a voltage differential of 300 mVolts greater than VSS, but may provide other voltage differentials in other embodiments. In one embodiment, the voltage difference between VDD and VSS is 1.2 volts, but may be of other voltage differentials in other embodiments.

Control circuit 106 includes an inverting gain stage 113 that includes P-channel transistor 117 and N-channel transistor 119. Circuit 106 includes another inverting gain stage 111 that includes transistors 121 and 123. Circuit 106 also includes a bias circuit 115 that includes transistors 125, 127, and 131. In one embodiment, the transistors of control circuit 106 are implemented in a bulk semiconductor substrate, but in other embodiments, may be implemented in other types of substrates such as semiconductor on insulator (SOI) substrate. In some embodiments with an SOI substrate, the body nodes of the transistors would be tied to ground VSS or other power supply terminal.

For stage 111, transistor 121 is configured as a diode to act as an active load to transistor 123. For stage 113, transistor 117 is configured as a current mirror with bias circuit 115 to provide a constant current source load to transistor 119 with constant current $I_L$. The bias circuit 115 generates a bias current $I_B$. $I_L$ is proportional to $I_B$. In other embodiments, other types of diodes may be used in stage 111.

Gain stage 113 and gain stage 111 are coupled to provide positive feedback in a control loop that uses negative feedback to control the voltage of node 107. The regulated voltage is provided to the gate of transistor 123. A gate is a control electrode of for a field effect transistor (FET). If the regulated voltage of node 107 changes due to a change in current consumption by circuit 103, then the voltage at the gate of transistor 123 changes to raise or lower the conductivity of transistor 123 accordingly. If the voltage of node 107 increases, then the conductivity of transistor 123 increases to lower the voltage at node 120. If the voltage at node 120 decreases, then the conductivity of transistor 119 decreases to raise the voltage of node 110. If the voltage of node 110 increases, the conductivity of regulating transistor increases to decrease the voltage of regulated node 107 back down to its designed regulated value.

If the voltage of node 107 were to unexpectantly decrease, then the voltage of the gate of transistor 123 would decrease to reduce the conductivity of transistor 123. A decrease in the conductivity of transistor 123 causes the voltage at node 120 to increase which lowers the voltage of node 110. Lowering the voltage of node 110 decreases the conductivity of transistor 109 to increase the voltage of node 107 back to its designed regulated level. Accordingly, with the gain stages configured in a control loop with negative feedback, a decrease or increase in the voltage of node 107 causes a increase or decrease, respectively, in the conductivity of transistor 109 to return regulated node 107 back to its designed regulated value (e.g. 300 mVolts).

Bias circuit 115 is configured to provide a bias current $I_B$. In the embodiment of FIG. 1, transistors 125 and 127 are configured as back-to-back diodes such that the voltage of node 114 is at a particular value based on the ratios of electrical characteristics (e.g. length, width, threshold voltage) of transistors 127 and 125. However, in other embodiments, other types of bias circuits may be used to bias load transistor 117 of stage 113. Also in other embodiments, bias circuit 115 may include one or more transistors that can be selectively enabled or disabled to adjust the voltage at the gate of transistor 117.

Regulator 105 includes enabling circuitry for enabling the providing of the raised regulated voltage at node 107. When the EN* signal is in a high deasserted state, transistor 129 is conductive to pull the voltage of node 107 to VSS. Also, when complementary enable signal EN is deasserted low, transistor 131 becomes non conductive to stop the flow of $I_B$.

As shown in the embodiment of FIG. 1, control circuit 106 can be used to control the voltage of node 107 without the use of an operational amplifier circuit. Accordingly, this circuit may consume less power to control a regulated voltage. Furthermore, providing a negative feedback control loop with an inverted gain stage having a diode load (e.g. 111) and another inverted gain stage having a biased transistor load may provide for a stable feedback loop with moderate gain. In one embodiment, control circuit 106 has a gain in the range of 20-30 dB, but may have a gain of other values in other embodiments.

Figure 2:
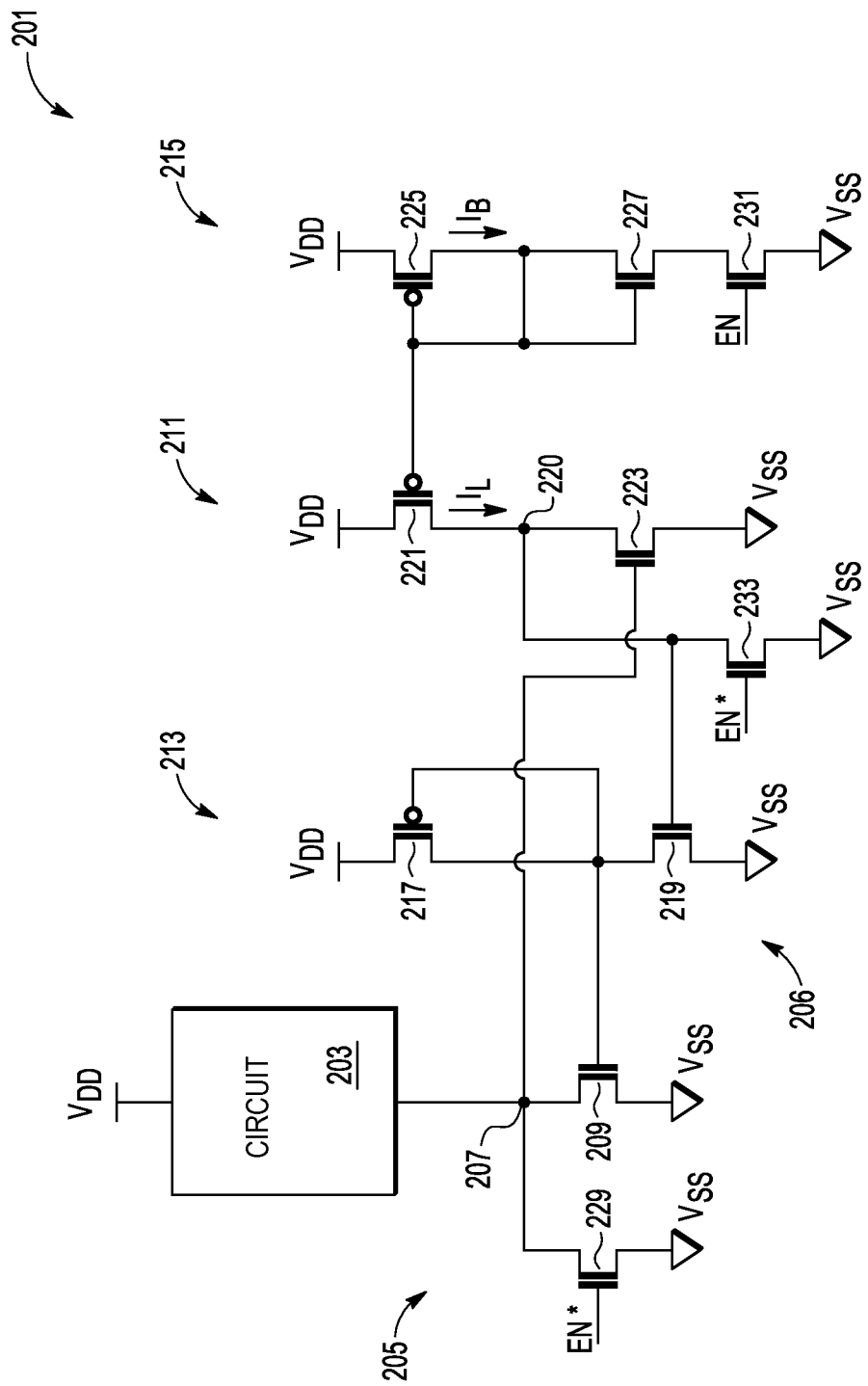
FIG. 2 is a circuit diagram of a circuit including a voltage regulator according to another embodiment of the present invention.

FIG. 2 is a circuit diagram of a circuit according to another embodiment of the present invention. Circuit 201 is similar to circuit 101 with circuit 203, node 207, regulating transistor 209, enabling transistor 229, enabling transistor 231, and bias circuit 215 being similar to circuit 103, node 107, regulating transistor 109, enabling transistor 129, enabling transistor 131, and bias circuit 115, respectively, of FIG. 1.

In the embodiment of FIG. 2, inverting gain stages 213 and 211 have a different configuration from stages 113 and 111 in providing a positive feedback for negative feedback control of the regulated voltage at node 207. In the embodiment of FIG. 2, transistor 217 is configured as a diode load and transistor 221 is configured as a transistor load whose conductivity is controlled to provide a load current ($I_L$) that is proportional to $I_B$. The regulated voltage node 207 is connected to the gate of transistor 223 to control the conductivity of transistor 223 which controls the voltage of node 220. The voltage of node 220 controls the conductivity of transistor 219, which controls the voltage at the gate of transistor 209.

If the voltage of node 207 decreases, then the conductivity of transistor 223 will decrease to raise the voltage of node 220. An increase in the voltage of node 220 causes the conductivity of transistor 219 to increase thereby lowering the voltage at the gate of transistor 209. Lowering the voltage of the gate of transistor 209 causes the conductivity of transistor 209 to decrease to raise the voltage of node 207 back to its designed regulated voltage.

If the voltage of node 207 increases, then the conductivity of transistor 223 will increase to lower the voltage of node 220. A decrease in the voltage of node 220 causes the conductivity of transistor 219 to decrease thereby raising the voltage at the gate of transistor 209. Raising the voltage of the gate of transistor 209 causes the conductivity of transistor 209 to increase to lower the voltage of node 207 back to its designed regulated voltage.

Circuit 206 includes an enabling transistor 233 that is made conductive when the EN* is at a deasserted high voltage to pull node 220 to VSS when regulator 205 is disabled.

Figure 3:
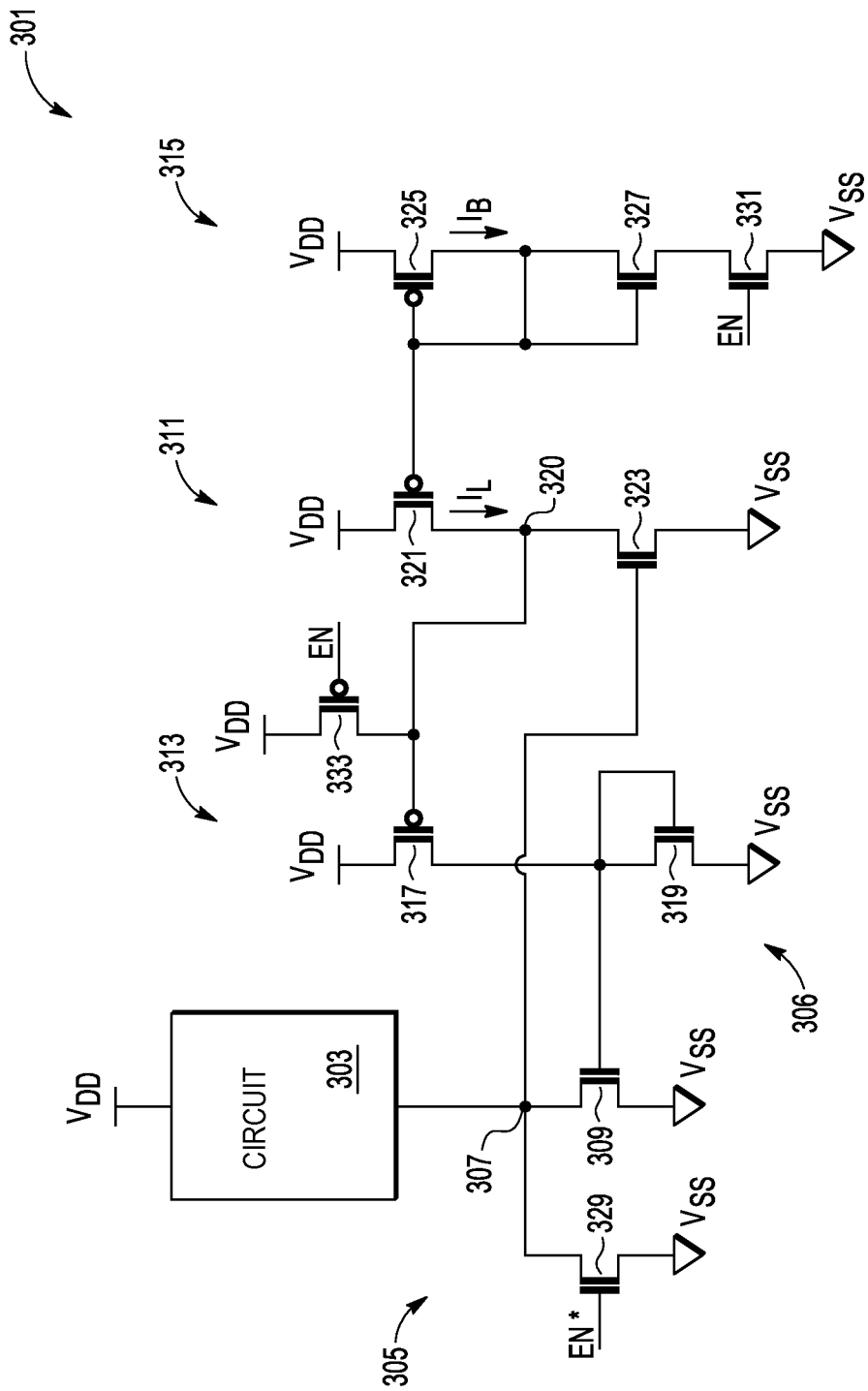
FIG. 3 is a circuit diagram of a circuit including a voltage regulator according to another embodiment of the present invention.

FIG. 3 is a circuit diagram of a circuit according to another embodiment of the present invention. Circuit 301 is similar to circuit 201 with circuit 303, node 307, regulating transistor 309, enabling transistor 329, enabling transistor 331, bias circuit 315, and gain stage 311 being similar to circuit 203, node 207, regulating transistor 209, enabling transistor 229, enabling transistor 231, bias circuit 215, and stage 211, respectively, of FIG. 2.

In the embodiment of FIG. 3, inverting gain stage 313 has a different configuration from stage 213 in providing a positive feedback with stage 311 for negative feedback control of the regulated voltage at node 307. In the embodiment of FIG. 3, N-channel transistor 319 is configured as a diode instead of the P-channel transistor 217 as in stage 213 of FIG. 2. The regulated voltage node 307 is connected to the gate of transistor 323 to control the conductivity of transistor 323 which controls the voltage of node 320. The voltage of node 320 controls the conductivity of transistor 317, which controls the voltage at the gate of transistor 309.

If the voltage of node 307 decreases, then the conductivity of transistor 323 will decrease to raise the voltage of node 320. An increase in the voltage of node 320 causes the conductivity of transistor 317 to decrease thereby lowering the voltage at the gate of transistor 309. Lowering the voltage of the gate of transistor 309 causes the conductivity of transistor 309 to decrease to raise the voltage of node 307 back to its designed regulated voltage.

If the voltage of node 307 increases, then the conductivity of transistor 323 will increase to lower the voltage of node 320. A decrease in the voltage of node 320 causes the conductivity of transistor 317 to increase thereby raising the voltage at the gate of transistor 309. Raising the voltage of the gate of transistor 309 causes the conductivity of transistor 309 to increase to lower the voltage of node 307 back to its designed regulated voltage.

Circuit 306 includes an enabling transistor 333 that is made conductive when the EN is at a deasserted low voltage to pull node 220 to VDD when voltage regulator 305 is selectively disabled.

FIGS. 1-3 set forth voltage regulators that can be selectively enabled to raise the low voltage power supply terminal of a circuit (e.g. 103, 203, and 303) from VSS to a regulated voltage above VSS to lower the power supply voltage provided to the circuit. In some embodiments, the regulated voltages of nodes 107, 207, and 307 would not be selectively enabled and disabled. For example, such embodiments would not include enabling transistors 129, 229, 329, 131, 231, 331, 233, and 333.

Figure 4:
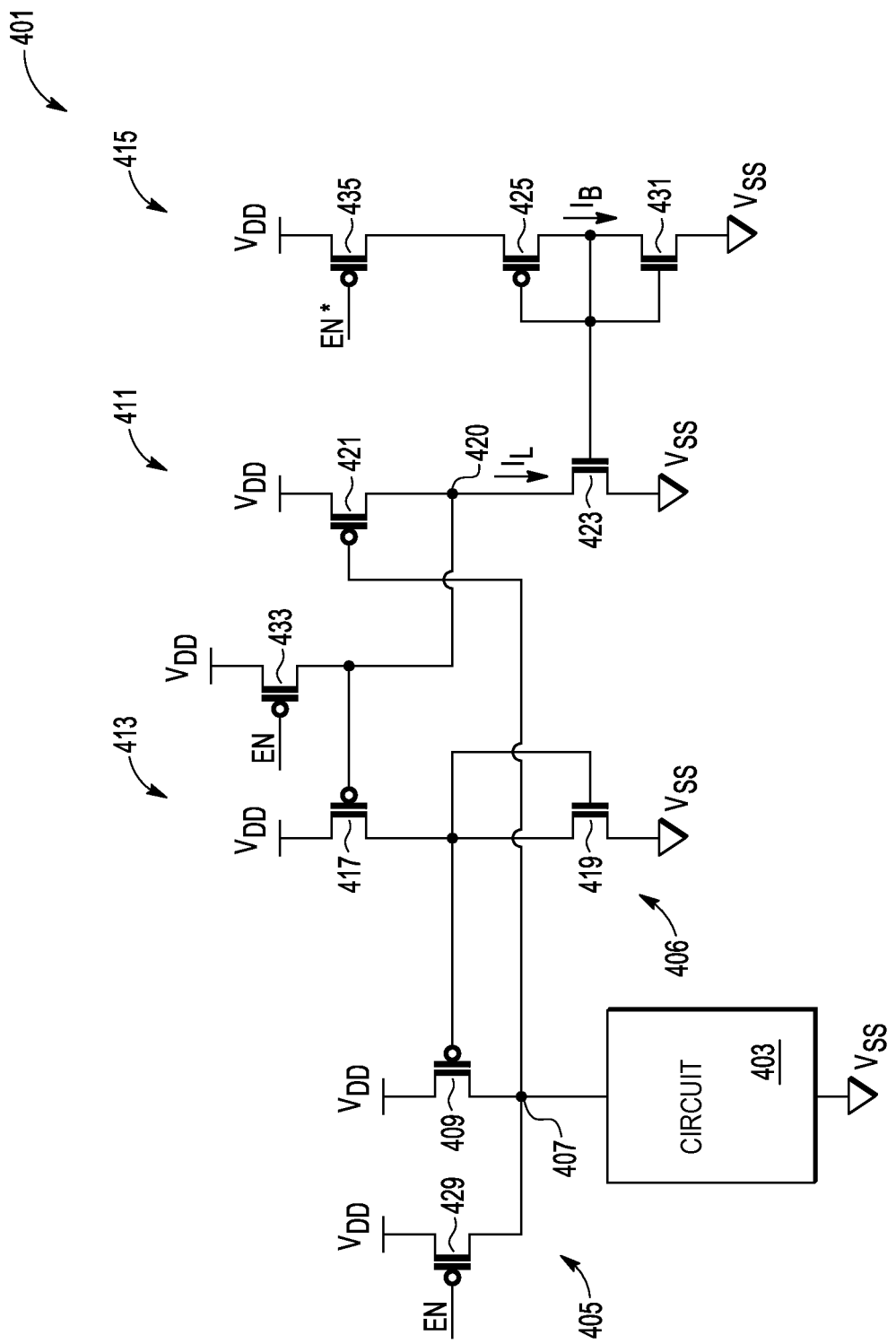
FIG. 4 is a circuit diagram of a circuit including a voltage regulator according to another embodiment of the present invention.

Also in other embodiments, a voltage regulator according to the present invention may be used to lower the voltage of the high power supply voltage terminal of a circuit (e.g. 403) from VDD to a lower regulated voltage value. For example, FIG. 4 shows a circuit 401 that has a voltage regulator 405 that regulates a voltage of node 407 at a voltage that is less than VDD (e.g. by 300 mVolts). Regulator 405 includes a control circuit 406 that has two inverting gain stages 413 and 411 configured in a positive feedback configuration to provide negative feedback control of the voltage of node 407. Stage 413 includes transistor 419 configured as a diode load and transistor 417 having a gate connected to node 420. Stage 411 includes a transistor 421 having a gate connected to node 407 and a transistor 423 that is configured as a transistor load to produce a current $I_L$ whose current is proportional to current $I_B$. Circuit 406 also includes a bias circuit 415 that includes transistors 425 and 431 configured as back-to-back diodes to produce a bias current $I_B$.

In FIG. 4, regulated voltage node 407 is connected to the gate of transistor 421 to control the conductivity of transistor 421 which controls the voltage of node 420. The voltage of node 420 controls the conductivity of transistor 417, which controls the voltage at the gate of regulating transistor 409.

If the voltage of node 407 decreases, then the conductivity of transistor 423 will increase to increase the voltage of node 420. An increase in the voltage of node 420 causes the conductivity of transistor 417 to decrease thereby lowering the voltage at the gate of transistor 409. Lowering the voltage of the gate of transistor 409 causes the conductivity of transistor 409 to increase to raise the voltage of node 407 back to its designed regulated voltage.

If the voltage of node 407 increases, then the conductivity of transistor 421 decreases to lower the voltage of node 420. A decrease in the voltage of node 420 causes the conductivity of transistor 417 to increase thereby raising the voltage at the gate of transistor 409. Raising the voltage of the gate of transistor 409 causes the conductivity of transistor 409 to decrease to lower the voltage of node 407 back to its designed regulated voltage.

Regulator 405 includes enabling transistors 429, 433, and 435 that can be used to selectively enable or disable the regulator 405. If disabled, regulated node 407 is pulled to VDD to make the power supply voltage across circuit 403 VDD.

In other embodiments where the voltage at node 407 is reduced from VDD, node 407 is connected to a gate of a transistor of the inverted gain stage with a diode load, and a node of the inverted gain stage with the transistor biased load is connected to the control electrode of regulating transistor 409. Also in other embodiments, the diode of an inverted gain stage with the diode load may be connected to the VDD terminal instead of the VSS terminal (as shown in FIG. 4).

In some embodiments both the low voltage and high voltage power supply terminals of a circuit (e.g. 103, 203, 303, and 403) may be connected to regulated nodes (e.g. 107 and 407) where both power supply terminals of a circuit can be regulated at voltages different than VSS and VDD respectively.

In one embodiment, a voltage regulator comprises a regulating transistor having a first current electrode for providing a regulated voltage, a second current electrode, and a control electrode. The voltage regulator comprises a control circuit having an output coupled to the control electrode of the regulating transistor, and an input coupled to the first current electrode of the regulating transistor. The control circuit comprising a first inverting gain stage having a first load element, and a second inverting gain stage having a second load element. One of the first load element or the second load element is characterized as being a diode and the other of the first load element or the second load element is biased by a bias circuit.

In another embodiment, a voltage regulator comprises a regulating transistor having a first current electrode for providing a regulated voltage, a second current electrode, and a control electrode. The voltage regulator comprises a first inverting gain stage that comprises a first transistor having a first current electrode, a control electrode and a second current electrode coupled together and that comprises a second transistor having a first current electrode coupled to the second current electrode of the first transistor, a control electrode coupled to the first current electrode of the regulating transistor, and a second current electrode. The voltage regulator comprises a second inverting gain stage that comprises a third transistor having a first current electrode, a control electrode, and a second current electrode coupled to the control electrode of the regulating transistor and that comprises a fourth transistor having a first current electrode coupled to the second current electrode of the third transistor, a control electrode coupled to the second current electrode of the first transistor, and a second current electrode. The voltage regulator comprises a bias circuit coupled to provide a bias voltage to the control electrode of the third transistor.

In another embodiment, a voltage regulator comprises a regulating transistor having a first current electrode for providing a regulated voltage, a second current electrode, and a control electrode. The voltage regulator comprises a first inverting gain stage that comprises a first transistor having a first current electrode, a control electrode, and a second current electrode and that comprises a second transistor having a first current electrode coupled to the second current electrode of the first transistor, a control electrode coupled to the first current electrode of the regulating transistor, and a second current electrode. The voltage regulator comprises a second inverting gain stage that comprises a third transistor having a first current electrode, and a second current electrode and a control electrode coupled together and to the control electrode of the regulating transistor and that comprises a fourth transistor having a first current electrode coupled to the second current electrode of the third transistor, a control electrode coupled to the second current electrode of the first transistor, and a second current electrode. The voltage regulator comprises a bias circuit coupled to provide a bias voltage to the control electrode of the first transistor.

As used herein the term "connected" with respect to two items being connected refers to the two items being directly coupled.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A voltage regulator comprising:
   a regulating transistor having a first current electrode for providing a regulated voltage, a second current electrode, and a control electrode; and
   a control circuit having an output coupled to the control electrode of the regulating transistor, and an input coupled to the first current electrode of the regulating transistor, the control circuit comprising a first inverting gain stage having a first load element, and a second inverting gain stage having a second load element, wherein one of the first load element or the second load element is characterized as being a diode and the other of the first load element or the second load element is biased by a bias circuit, wherein one of the first inverting gain stage or the second inverting gain stage includes an input transistor that includes a control electrode coupled to the first current electrode of the regulating transistor, wherein the regulating transistor and the input transistor are of a same channel conductivity type;
   wherein the bias circuit comprises:
      a first transistor having a first current electrode coupled to a first power supply voltage terminal, a second current electrode and a control electrode both coupled together, and
      a second transistor having a first current electrode and a control electrode both coupled to the second current electrode and the control electrode of the first transistor, and a second current electrode coupled to a second power supply voltage terminal.

2. The voltage regulator of claim 1, wherein the first inverting gain stage further comprises the input transistor, the input transistor has a first current electrode coupled to a first terminal of the first load element and a second current electrode coupled to a power supply voltage terminal.

3. The voltage regulator of claim 1, wherein the second inverting gain stage further comprises a first transistor having a first current electrode coupled to a first terminal of the second load element, a second current electrode coupled to a first power supply voltage terminal, and a control electrode coupled to an output terminal of the first inverting gain stage.

4. The voltage regulator of claim 1, wherein the second load element comprises a third transistor having a first current electrode coupled to the first power supply voltage terminal, a control electrode coupled to the second current electrode of the first transistor, and a second current electrode coupled to the control electrode of the regulating transistor.

5. The voltage regulator of claim 1, wherein the first load element comprises a first transistor having a first current electrode coupled to a first power supply voltage terminal, and a second current electrode and a control electrode coupled together.

6. The voltage regulator of claim 1, wherein the first load element of the first inverting gain stage comprises a diode, the first inverting gain stage has an input coupled to the first current electrode of the regulating transistor, and the first inverting gain stage has an output, and wherein the second load element is biased by the bias circuit, the second inverting gain stage has an input coupled to the output of the first inverting gain stage, and the second inverting gain stage has an output coupled to the control electrode of the regulating transistor.

7. The voltage regulator of claim 1, wherein the first load element comprises a third transistor having a first current electrode coupled to a first power supply voltage terminal, a second current electrode coupled to an input of the second inverting gain stage, and a control electrode coupled to the bias circuit in a current mirror configuration.

8. The voltage regulator of claim 1, wherein the diode is further characterized as being a diode-connected transistor.

9. A voltage regulator comprising:
a regulating transistor having a first current electrode for providing a regulated voltage, a second current electrode, and a control electrode; and
a control circuit having an output coupled to the control electrode of the regulating transistor, and an input coupled to the first current electrode of the regulating transistor, the control circuit comprising a first inverting gain stage having a first load element, and a second inverting gain stage having a second load element, wherein one of the first load element or the second load element is characterized as being a diode and the other of the first load element or the second load element is biased by a bias circuit;
wherein the first load element of the first inverting gain stage is biased by the bias circuit, the first inverting gain stage has an input coupled to the first current electrode of the regulating transistor, and the first inverting gain stage as an output, and wherein the second load element includes a diode, the second inverting gain stage has an input coupled to the output of the first inverting gain stage, and the second inverting gain stage has an output coupled to the control electrode of the regulating transistor.

10. The voltage regulator of claim 9, wherein the bias circuit comprises:
a first transistor having a first current electrode coupled to a first power supply voltage terminal, a second current electrode and a control electrode both coupled together, and
a second transistor having a first current electrode and a control electrode both coupled to the second current electrode and the control electrode of the first transistor, and a second current electrode coupled to a second power supply voltage terminal.

11. A voltage regulator comprising:
a regulating transistor having a first current electrode for providing a regulated voltage, a second current electrode, and a control electrode;
a first inverting gain stage comprising:
a first transistor having a first current electrode, a control electrode and a second current electrode coupled together; and
a second transistor having a first current electrode coupled to the second current electrode of the first transistor, a control electrode coupled to the first current electrode of the regulating transistor, and a second current electrode;
a second inverting gain stage comprising:
a third transistor having a first current electrode, a control electrode, and a second current electrode coupled to the control electrode of the regulating transistor; and
a fourth transistor having a first current electrode coupled to the second current electrode of the third transistor, a control electrode coupled to the second current electrode of the first transistor, and a second current electrode; and
a bias circuit coupled to provide a bias voltage to the control electrode of the third transistor;
wherein the regulating transistor and the second transistor are of a first channel conductivity type and the first transistor is of a second channel conductivity type opposite the first channel conductivity type.

12. The voltage regulator of claim 11, wherein the bias circuit comprises:
a fifth transistor having a first current electrode coupled to a first power supply voltage terminal, a second current electrode and a control electrode both coupled together and to the control electrode of the third transistor; and
a sixth transistor having a first current electrode and a control electrode both coupled to the second current electrode and the control electrode of the fifth transistor, and a second current electrode coupled to a second power supply voltage terminal.

13. The voltage regulator of claim 11, further comprising an enabling transistor coupled in parallel with the regulating transistor, the enabling transistor responsive to an enable signal for enabling and disabling the voltage regulator.

14. The voltage regulator of claim 11, wherein the first current electrode of the regulating transistor is coupled to provide the regulated voltage to a memory array.

15. The voltage regulator of claim 11, wherein the regulating transistor, the second transistor, and the fourth transistor are N-channel transistors and the first transistor and the third transistor are P-channel transistors.

16. The voltage regulator of claim 11 wherein the second current electrode of the second transistor and the second current electrode of the fourth transistor are each coupled to a first power supply terminal.

17. A voltage regulator comprising:
a regulating transistor having a first current electrode for providing a regulated voltage, a second current electrode, and a control electrode;
a first inverting gain stage comprising:
a first transistor having a first current electrode, a control electrode, and a second current electrode; and a second transistor having a first current electrode coupled to the second current electrode of the first transistor, a control electrode coupled to the first current electrode of the regulating transistor, and a second current electrode;

a second inverting gain stage comprising:
  a third transistor having a first current electrode, and a second current electrode and a control electrode coupled together and to the control electrode of the regulating transistor; and
  a fourth transistor having a first current electrode coupled to the second current electrode of the third transistor, a control electrode coupled to the second current electrode of the first transistor, and a second current electrode; and a bias circuit coupled to provide a bias voltage to the control electrode of the first transistor.

18. The voltage regulator of claim 17, wherein the bias circuit forms a current mirror with the first transistor.

19. The voltage regulator of claim 17, wherein the regulating transistor, the second transistor and the fourth transistor are N-channel transistors, and the first transistor and the third transistor are P-channel transistors.

20. The voltage regulator of claim 17, further comprising an enabling transistor coupled in parallel with the regulating transistor, the enabling transistor responsive to an enable signal for enabling and disabling the voltage regulator.

21. The voltage regulator of claim 17, wherein the bias circuit comprises:
  a fifth transistor having a first current electrode coupled to a first power supply voltage terminal, and a second current electrode and control electrode coupled together; and
  a sixth transistor having a first current electrode and control electrode coupled together, and a second current electrode coupled to a second power supply voltage terminal.

\* \* \* \* \*